United States Patent
Ella et al.

(10) Patent No.: US 12,294,349 B2
(45) Date of Patent: May 6, 2025

(54) BULK ACOUSTIC WAVE DEVICES WITH SANDWICH ELECTRODES FOR HIGHER RESONANT FREQUENCIES, AND RELATED FABRICATION METHODS

(71) Applicant: RF360 Singapore Pte. Ltd., Singapore (SG)

(72) Inventors: Juha Sakari Ella, Salo (FI); Edgar Schmidhammer, Stein an der Traun (DE)

(73) Assignee: RF360 Singapore Pte. Ltd., Singapore (SG)

( * ) Notice: Subject to any disclaimer, the term of this patent is extended or adjusted under 35 U.S.C. 154(b) by 238 days.

(21) Appl. No.: 17/933,564

(22) Filed: Sep. 20, 2022

(65) Prior Publication Data
US 2024/0097642 A1    Mar. 21, 2024

(51) Int. Cl.
*H03H 9/02* (2006.01)
*H03H 3/02* (2006.01)
*H03H 9/13* (2006.01)
*H03H 9/56* (2006.01)

(52) U.S. Cl.
CPC .......... *H03H 9/02086* (2013.01); *H03H 3/02* (2013.01); *H03H 9/131* (2013.01); *H03H 9/568* (2013.01)

(58) Field of Classification Search
CPC .. H03H 9/02007; H03H 9/0014; H03H 9/568; H03H 9/131; H03H 9/58
USPC .................................................. 333/186–192
See application file for complete search history.

(56) References Cited

U.S. PATENT DOCUMENTS

| | | | |
|---|---|---|---|
| 2006/0164186 A1* | 7/2006 | Stoemmer | H03H 9/0542 333/191 |
| 2009/0267457 A1* | 10/2009 | Barber | H03H 3/02 29/25.35 |
| 2009/0309677 A1* | 12/2009 | Schmidhammer | H03H 3/04 333/195 |
| 2014/0125203 A1* | 5/2014 | Choy | H03H 9/173 310/365 |

(Continued)

OTHER PUBLICATIONS

International Search Report and Written Opinion for International Patent Application No. PCT/SG2023/050620, mailed Dec. 20, 2023, 13 pages.

(Continued)

*Primary Examiner* — Rakesh B Patel
(74) *Attorney, Agent, or Firm* — W&T

(57) ABSTRACT

A bulk acoustic wave (BAW) device comprises a piezoelectric layer disposed between a first electrode layer and a sandwich electrode. The sandwich electrode includes a first layer of a first material having a first acoustic impedance and a second layer of a second material having a second acoustic impedance that is less than the first acoustic impedance of the first layer. The second layer of the sandwich electrode having the lower acoustic impedance is disposed between the first layer and the piezoelectric layer. The sandwich electrode combined with the piezoelectric layer and first electrode can cause the BAW device to resonate at a frequency whose wavelength corresponds to an acoustic cavity length of the BAW device, depending on an acoustic mirror included on one side of the BAW device. In one example, the acoustic cavity length is about 1.5 times of the resonant frequency wavelength.

12 Claims, 7 Drawing Sheets

(56) References Cited

U.S. PATENT DOCUMENTS

2015/0349743 A1   12/2015  Burak et al.
2016/0365842 A1*  12/2016  Marksteiner ............ H03H 9/54
2017/0310303 A1*  10/2017  Thalhammer ...... H03H 9/02125
2019/0326873 A1   10/2019  Bradley et al.

OTHER PUBLICATIONS

U.S. Appl. No. 18/468,847, filed Sep. 18, 2023.

\* cited by examiner

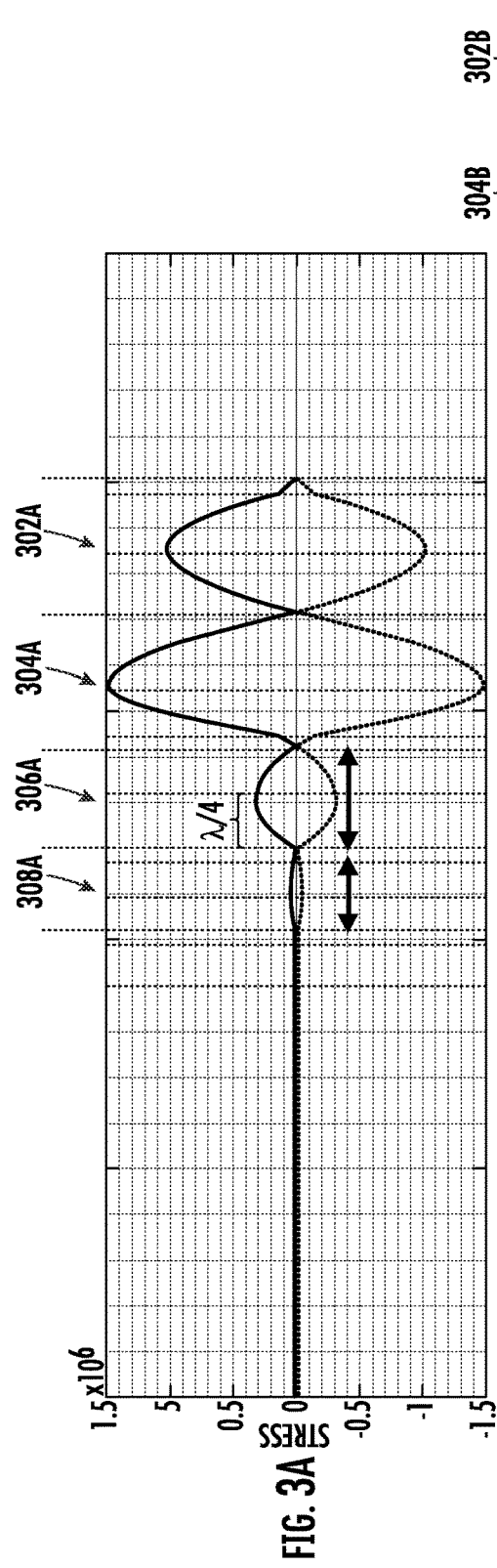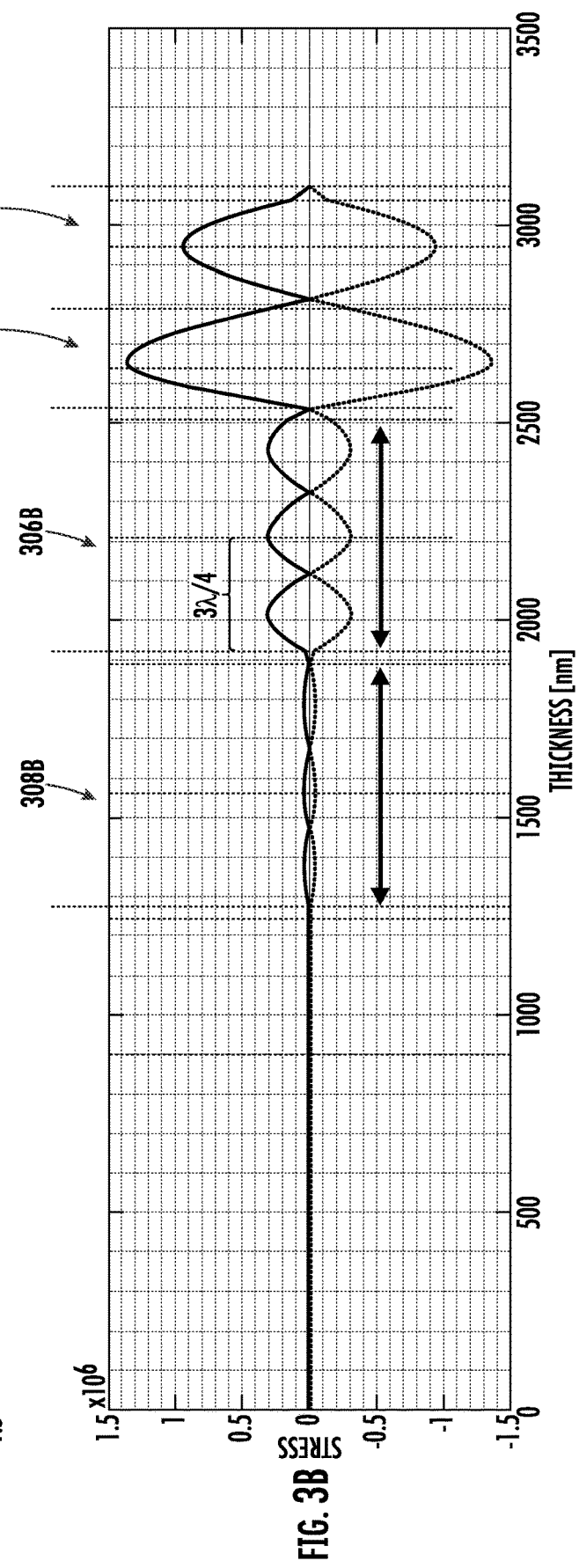

BULK ACOUSTIC WAVE DEVICES WITH SANDWICH ELECTRODES FOR HIGHER RESONANT FREQUENCIES, AND RELATED FABRICATION METHODS

BACKGROUND

I. Field of the Disclosure

The technology of the disclosure relates generally to micro-acoustic devices and, more particularly, to bulk acoustic wave (BAW) devices employed in acoustic filters.

II. Background

Wireless devices, such as cellular telephones, communicate by transmitting and receiving electromagnetic waves through the air. Cellular telephones are allowed to operate within certain ranges of radio frequencies. The frequencies available for operation are different depending on the geographical region (e.g., country) and are limited to certain frequency bands or ranges, which may be surrounded (e.g., above and below) by frequency bands allocated to other applications. Thus, to avoid interference, cellular telephones need to include frequency filters that allow certain frequencies while blocking others. The frequencies transmitted by a wireless device can be filtered by micro-acoustic devices that are small enough to fit into a handheld device.

Examples of micro-acoustic devices include surface acoustic wave (SAW) devices and bulk acoustic wave (BAW) devices. BAW devices receive an electrical signal that produces a varying (RF) electric field between two electrodes in a BAW device, causing the piezo layer positioned between the electrodes to expand and contract to produce acoustic waves having a resonant frequency depending on the physical characteristics of the BAW device.

A BAW device includes a layer of piezoelectric material sandwiched between electrode layers. The thicknesses of those layers determine the frequencies that resonate in a BAW device. As new generations of cellular technology employing higher frequencies evolve (e.g., 5G, 6G, 7G), the need to provide filters that are capable of filtering higher frequencies also needs to evolve. A conventional BAW device resonates at a frequency with a wavelength twice the total thickness of a piezoelectric layer, an upper electrode, and a lower electrode. To make a conventional BAW device of this type with a higher resonant frequency requires a reduction of the thicknesses of the piezoelectric layer and/or the electrodes. Devices with thinner electrode layers are more difficult to manufacture (e.g., with consistent thickness) and have increased electrical resistance in the electrodes. To reduce a total thickness of the device without reducing electrode thickness, the piezoelectric layer must be thinner, which is also difficult to manufacture and increases the capacitance between the electrodes. To avoid increasing capacitance, the device area can be reduced, but this increases power density, which limits the power handling capability of the device. Smaller devices are also poor heat conductors, and thinner piezoelectric layers have lower breakdown voltages.

SUMMARY

Aspects disclosed in the detailed description include bulk acoustic wave (BAW) devices with sandwich electrodes for higher resonant frequencies. Methods of fabricating BAW devices, including sandwich electrodes, are also disclosed. A conventional BAW device used in wired and wireless communication resonates at a resonant frequency at which the wavelength is two times the acoustic cavity length of the BAW device. The acoustic cavity length is based on the total thickness of a first electrode, a piezoelectric layer, and a second electrode. In an exemplary BAW device disclosed herein, in which one of the electrodes is a sandwich electrode, a thickness of the sandwich electrode corresponds to half of the wavelength of the resonant frequency. A sandwich electrode includes an outer layer with a higher acoustic impedance and an inner layer with a lower acoustic impedance, with the inner layer disposed between (i.e., sandwiched between) the outer layer and the piezoelectric layer. In this regard, an increase in the frequencies of BAW filters does not depend exclusively on thinning the piezoelectric layer and the electrodes. In some examples, the acoustic cavity length of the BAW device corresponds to one full wavelength of the resonant frequency, where half of the cavity length is the thickness of the sandwich electrode, and the other half is based on a thickness of the piezoelectric layer and a second electrode on the other side of the piezoelectric layer. In other examples, in which the second electrode is also a sandwich electrode, the acoustic cavity length of the BAW device corresponds to one and a half (1.5) times the resonant frequency wavelength. In such other examples, each of the second sandwich electrode and the piezoelectric layer has a thickness corresponding to half of the resonant frequency wavelength.

In an exemplary aspect, a BAW device is disclosed. The BAW device comprises a piezoelectric layer, a first electrode on a first side of the piezoelectric layer, and a sandwich electrode on a second side of the piezoelectric layer. The sandwich electrode comprises a first layer of a first material having a first acoustic impedance and a second layer of a second material having a second acoustic impedance less than the first acoustic impedance, the second layer disposed between the first layer and the piezoelectric layer.

In another exemplary aspect, a method of fabricating a BAW device is disclosed. The method includes forming a first electrode, forming a piezoelectric layer comprising a first side on the first electrode, and forming a sandwich electrode on a second side of the piezoelectric layer. The second electrode comprises a first layer comprising a first material, and a second layer of a second material, the second layer between the first layer and the piezoelectric layer. A first acoustic impedance of the first material is greater than a second acoustic impedance of the second material.

In a further exemplary aspect, an acoustic filter is disclosed. The acoustic filter includes a first bulk acoustic wave (BAW) device and a second BAW device. Each of the first and second BAW devices comprises a piezoelectric layer, a first electrode on a first side of the piezoelectric layer, and a sandwich electrode on a second side of the piezoelectric layer. The sandwich electrode comprises a first layer of a first material having a first acoustic impedance and a second layer of a second material having a second acoustic impedance less than the first acoustic impedance, and the second layer disposed between the first layer and the piezoelectric layer.

BRIEF DESCRIPTION OF THE DRAWINGS

FIG. 3A is a graphical representation of acoustic waves in the BAW device 100A in FIG. 1, which comprises an acoustic mirror with layers corresponding to one quarter (¼) of a resonant frequency wavelength;

FIG. 3B is a graphical representation of acoustic waves in the BAW device 100B in FIG. 1, which comprises an acoustic mirror with layers corresponding to three quarters (¾) of a resonant frequency wavelength;

DETAILED DESCRIPTION

Figure 1:
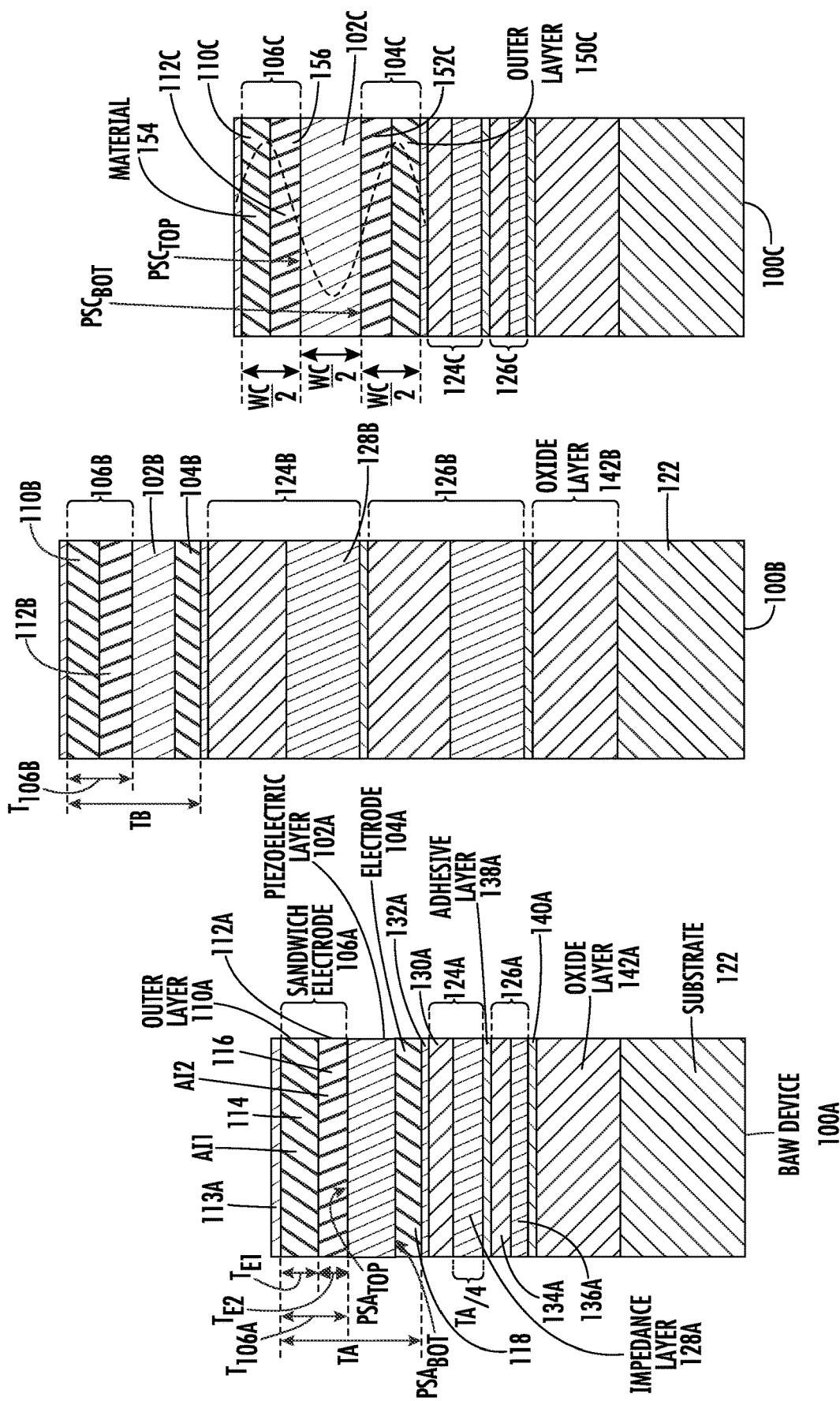
FIG. 1 is an illustration of a cross-sectional view of exemplary bulk acoustic wave (BAW) devices of solidly mounted resonators (SMRs), each comprising a sandwich electrode that includes an outer layer with a higher acoustic impedance and an inner layer with a lower acoustic impedance, with the inner layer disposed between (i.e., sandwiched) between the outer layer and the piezoelectric layer, to provide a higher resonant frequency.

With reference now to the drawing figures, several exemplary aspects of the present disclosure are described. The word "exemplary" is used herein to mean "serving as an example, instance, or illustration." Any aspect described herein as "exemplary" is not necessarily to be construed as preferred or advantageous over other aspects.

Aspects disclosed in the detailed description include bulk acoustic wave (BAW) devices with sandwich electrodes for higher resonant frequencies. Methods of fabricating BAW devices, including sandwich electrodes, are also disclosed. A conventional BAW device used in wired and wireless communication resonates at a resonant frequency at which the wavelength is two times the acoustic cavity length of the BAW device. The acoustic cavity length is based on the total thickness of a first electrode, a piezoelectric layer, and a second electrode. In an exemplary BAW device disclosed herein, in which one of the electrodes is a sandwich electrode, a thickness of the sandwich electrode corresponds to half of the wavelength of the resonant frequency. A sandwich electrode includes an outer layer with a higher acoustic impedance and an inner layer with a lower acoustic impedance, with the inner layer disposed between (i.e., sandwiched between) the outer layer and the piezoelectric layer. In this regard, an increase in the frequencies of BAW filters does not depend exclusively on thinning the piezoelectric layer and the electrodes. In some examples, the acoustic cavity length of the BAW device corresponds to one full wavelength of the resonant frequency, where half of the cavity length is the thickness of the sandwich electrode, and the other half is based on a thickness of the piezoelectric layer and a second electrode on the other side of the piezoelectric layer. In other examples, in which the second electrode is also a sandwich electrode, the acoustic cavity length of the BAW device corresponds to one and a half (1.5) times the resonant frequency wavelength. In such other examples, each of the second sandwich electrode and the piezoelectric layer has a thickness corresponding to half of the resonant frequency wavelength.

FIG. 1 is an illustration of cross-sectional views of examples of bulk acoustic wave (BAW) devices 100A, 100B, and 100C, which each comprise a sandwich electrode having a thickness corresponding to a half wavelength of a resonant frequency. The sandwich electrodes reduce the need for thinning electrodes and piezoelectric layers to achieve a higher frequency because the sandwich electrode changes operation of the BAW device from resonating at a frequency whose wavelength corresponds to twice the acoustic cavity length of the BAW device (as in conventional devices) to resonating at a frequency having a wavelength corresponding to the acoustic cavity length. The BAW device 100A is a first example in which a piezoelectric layer 102A is disposed between an electrode 104A and a sandwich electrode 106A. The electrode 104A in FIG. 1 is on the bottom side $PSA_{BOT}$ of the piezoelectric layer 102A. The sandwich electrode 106A is on the top side $PSA_{TOP}$ of the piezoelectric layer 102A. The bottom side $PSA_{BOT}$ of the piezoelectric layer 102A is opposite the top side $PSA_{TOP}$ of the piezoelectric layer 102A. As the name would imply, the sandwich electrode 106A has more than one layer, including an outer layer 110A and an inner layer 112A. The inner layer 112A is disposed between the outer layer 110A and the top side $PSA_{TOP}$ of the piezoelectric layer 102A. In other examples, the electrode 104A may be on the top side $PSA_{TOP}$ of the piezoelectric layer 102A, and the sandwich electrode 106A may be on the bottom side $PSA_{BOT}$.

The piezoelectric layer 102A, the electrode 104A, and the electrode 106A of the BAW device have a total thickness TA. The total thickness TA corresponds to an acoustic cavity length, which is equal to a full wavelength of a resonant frequency of the BAW device 100A. Specifically, the wavelength of the resonant frequency of the BAW device, which is the acoustic cavity length, is primarily determined by the thicknesses of all the layers of the BAW device 100A and the materials of which they are comprised. Thicknesses of a passivation layer 113A and the isolation layer 132A form part of the acoustic cavity length, but these layers are relatively much thinner than the piezoelectric layer 102A, the electrode 104A, and the electrode 106A and comprise only a small percentage of the total thickness TA.

At a frequency FA, each of the piezoelectric layer 102A, the electrode 104A, and the electrode 106A make up a fraction of the acoustic cavity length, which corresponds to a wavelength of the resonant frequency FA of the BAW device 100A. The fraction of the wavelength corresponds to an acoustic thickness, where the desired acoustic thickness of each layer determines a physical thickness based on an acoustic velocity of the layer material. The combined physical thicknesses of the piezoelectric layer 102A, the electrode 104A, and the electrode 106A determine the total physical thickness TA.

Generally, a wavelength Lw of a layer of a given material in a BAW device is equal to an acoustic velocity Va of the material (e.g., in meters/second) divided by the frequency. Each layer's physical thickness is set to correspond to some fraction of the total wavelength. Thus, for example, a thickness $T_{106A}$ of the sandwich electrode 106A corresponds to a fraction F1 of a wavelength of the resonant frequency FA, where the fraction F1 is equal to a sum of a fraction F2 of the wavelength in the outer layer 110A plus a fraction F3 of the wavelength in the inner layer 112A. In other words, F1=F2+F3. The physical thickness $T_{E1}$ of the outer layer 110A and the physical thickness $T_{E2}$ of the inner layer 112A are determined by the equations:

$$T_{E1}=(F2 \times V_{112A})/FA; \text{ and } T_{E2}=(F3 \times V_{110})/FA$$

where $V_{112A}$ and $V_{110A}$ are the respective acoustic velocities of the materials in the outer and inner layers 110A and 112A. An acoustic thickness of a layer is determined by the wavelength fraction (e.g., F2, F3) times the wavelength of the frequency FA.

The piezoelectric layer 102A and the electrode 104A, combined, have a total thickness of TA-$T_{106A}$, corresponding to the remaining fraction F4 of the acoustic cavity length. In the BAW devices 100A, one full wavelength at frequency FA corresponds to the acoustic cavity length. Therefore, the fraction F4 of the wavelength attributed to piezoelectric layer 102A and the electrode 104A is equal to 1-F1. The physical thickness of the piezoelectric layer 102A and the electrode 104A, combined, will depend on the materials of the piezoelectric layer 102A and the electrode 104A and their corresponding fractions of a wavelength. The physical measure $T_{106A}$ of the sandwich electrode 106A may be more or less than the measure TA-$T_{106A}$ of the combined piezoelectric layer 102A and electrode 104A because the fractions F1 and F4 are not based only on a physical layer thickness. It should be noted that the fraction F1 of the wavelength attributed to the sandwich electrode 106A plus the fraction F4 of the wavelength in the piezoelectric layer 102A and the second electrode 104A may be less than one (1) because small portions of the acoustic cavity length are attributed to the passivation layers 113A and 132A of the BAW device 100A.

The acoustic velocities $V_{110A}$ and $V_{112A}$ depend on the materials of the outer layer 110A and the inner layer 112A. The acoustic thicknesses depend on their acoustic velocities $V_{110A}$ and $V_{112A}$ and their respective thicknesses. The outer layer 110A of the sandwich electrode 106A is a layer of a material 114 having a thickness $T_{E1}$, and the inner layer 112A is a layer of material 116 having a thickness $T_{E2}$. The total thickness of the sandwich electrode $T_{106A}$ is equal to $T_{E1}+T_{E2}$. The material 114 may be a metal having an acoustic impedance AI1. The inner layer 112A of the sandwich electrode 106A has an acoustic impedance AI2. The acoustic impedance AI1 of the material 114 is greater than the acoustic impedance AI2 of the material 116. The material 114 also has a higher density than the material 116. The material 114 of the outer layer 110A may also be non-metallic material with a higher acoustic impedance. The acoustic impedances AI1, AI2 determine the acoustic velocities of the inner layer 112A and the outer layer 110A.

In some examples, the material 114 of the outer layer 110A may be molybdenum (Mo), tungsten (W), or gold (Au). The material 116 has a lighter density or molecular weight and may also have a lower resistivity than the material 114 of the outer layer 110A. In some examples, the material 114 of the inner layer 112A may be a metal or alloy, including aluminum (Al), aluminum scandium (AlSc), aluminum copper (AlCu), beryllium (Be), or magnesium (Mg). The electrode 104A is formed of a material 118, which may be the same as or different from material 114 of the outer layer 110A. An example of a material of the piezoelectric layer 102A in such examples is aluminum scandium nitride (AlScN) (for example, AlSc30N) or aluminum nitride (AlN), but the BAW device 100A is not limited in this regard.

The BAW device 100A may be referred to as a solidly mounted resonator (SMR) as it is mounted on a substrate 122. The BAW device 100A further includes a first acoustic mirror 124A and a second acoustic mirror 126A for acoustic isolation from the substrate 122. The first and second acoustic mirrors 124A and 126A may also affect the acoustic cavity length of the BAW device 100A. The first acoustic mirror 124A includes an impedance layer 128A having a high acoustic impedance separated from the electrode 104A by a layer 130A having a lower acoustic impedance. The impedance layer 128A and the layer 130A may, irrespective of the other, be a metal material or a dielectric material. The impedance layer 128A has an acoustic thickness of approximately one-quarter (¼) of the wavelength WA (WA/4) to reduce the propagation of acoustic waves from the BAW device 100A to the substrate 122. A layer 130A may be a dielectric layer, such as silicon dioxide (SiO2), for example, and the impedance layer 128A may be any material of high acoustic impedance, such as Tungsten (W). The layer 130A may optionally be separated from the electrode 104A by the isolation layer 132A, which can be provided to improve the structure of the bottom electrode to allow for growth of a higher quality piezoelectric layer. The second acoustic mirror 126A is similar to the first acoustic mirror 124A, having a layer 134A of lower acoustic impedance and an impedance layer 136A of higher acoustic impedance. The first and second acoustic mirrors 124A, 126A may be joined by an adhesive layer 138A, such as a titanium (Ti) layer. The second acoustic mirror 126A couples to the substrate 122 through another adhesive (e.g., Ti) layer 140A and a layer 142A, such as a dielectric layer (e.g., SiO2) that is formed on the substrate 122. The materials identified herein are merely non-limiting examples of materials that may be used in the acoustic mirrors of an SMR, including the BAW device 100A.

FIG. 1 also includes the BAW device 100B, which includes a piezoelectric layer 102B disposed between an electrode 104B and a sandwich electrode 106B, where the sandwich electrode 106B has an outer layer 110B and an inner layer 112B between the outer layer 110B and a top surface $PSB_{TOP}$ of the piezoelectric layer 102B. A thickness $T_{106B}$ of the sandwich electrode 106B is determined based on the acoustic velocities of the inner layer 112B and the outer layer 110B to provide an acoustic thickness equal to about half of a total acoustic cavity length of the BAW device 100B. The combination of the piezoelectric layer 102B and electrode 104B make up the rest of the physical thickness TB and also make up the other half of the acoustic cavity length of the BAW device 100B that corresponds to a wavelength WB of a resonant frequency FB.

The BAW device 100B is also an SMR disposed on the substrate 122 and differs from the BAW device 100A only with respect to the acoustic mirrors 124B and 126B. In particular, the impedance layer 128B has an acoustic thickness set to three-quarters of the wavelength WB (WB/4)= (¾×WB) to significantly reduce the propagation of acoustic waves from the BAW device 100B into the substrate 122. In some examples, the second acoustic mirror 126B may also include an impedance layer 136A having an acoustic thickness of (¾×WB). The BAW device 100B also includes other layers corresponding to the layers of the BAW device 100A discussed above for the same purposes, which are not repeated here. The second acoustic mirror 126B is separated from the substrate 122 by a dielectric layer 142B comprising SiO2 or another suitable material for coupling the acoustic mirror 126B to the substrate 122.

FIG. 1 also shows the BAW device 100C, which includes a piezoelectric layer 102C disposed between an electrode 104C and a sandwich electrode 106C, where the sandwich electrode 106C has an outer layer 110C and an inner layer 112C. The inner layer 112C is between the outer layer 110C and a top surface PSC$_{TOP}$ of the piezoelectric layer 102C. The BAW device 100C differs from the BAW devices 100A and 100B because the electrode 104C is a sandwich electrode 104C, similar to the sandwich electrode 106C, and not a single layer like the electrodes 104A and 104B. The sandwich electrode 104C includes an outer layer 150C and an inner layer 152C, with the inner layer 152C disposed between the outer layer 150C and a bottom layer PSC$_{BOT}$ of the piezoelectric layer 102C.

The BAW device 100C has an acoustic cavity length based on the sandwich electrode 104C, the piezoelectric layer 102C, and the sandwich electrode 106C, where the acoustic cavity length corresponds to 1.5 times the wavelength WC of a resonant frequency FC. Each of the sandwich electrodes 104C and 106C and the piezoelectric layer 102C correspond to an acoustic thickness WC/2, which is half of the wavelength WC of a resonant frequency FC of the BAW device 100C. Therefore, the total acoustic cavity length of the BAW device 100C is approximately equal to 1.5 times the wavelength WC (e.g., 3×(WC/2)) of the resonant frequency FC. Stated differently, the wavelength WC is two-thirds (⅔) of the total acoustic cavity length of the BAW device 100C.

The layers of the sandwich electrodes 104C and 106C correspond in composition to the layers of the sandwich electrode 106A. The outer layers 150C and 110C may comprise a same material 154 having a higher acoustic impedance CI1, and the inner layers 152C and 112C may comprise a same material 156, having a lower acoustic impedance CI2. The material 154 may be metal or a non-metallic material having a higher acoustic impedance CI1 than the material 156 having the lower impedance CI2. The difference in acoustic impedance may be due to the density of the material 154 being higher than the density of material 156. For example, the outer layer 150C may comprise Mo or W, and the inner layer 152C may comprise Al, AlCu, AlSc, or Mg. Alternatively, the outer layer 110C and the inner layer 112C of the sandwich electrode 106C may be formed of or comprise different materials than the outer layer 150C and the inner layer 152C of the sandwich electrode 104C.

The BAW device 100C also includes acoustic mirrors 124C and 126C for isolation from the substrate 122. The acoustic mirrors 124C and 126C are the same as the acoustic mirrors 124A and 126A in the BAW device 100A. For example, the acoustic mirror 124C includes an impedance layer 128C having a high acoustic impedance. The impedance layer 128C is separated from the electrode 104A by layer 130C, having a lower acoustic impedance. The impedance layer 128C has a thickness approximately equal to one quarter (¼) of the wavelength WC (WC/4) to significantly reduce propagation of acoustic waves from the BAW device 100A to the substrate 122. The layers 128C and 130C may be formed of the same materials as the layers 128A and 130A discussed above. The BAW device 100C also includes an isolation layer 132C to electrically insulate the acoustic mirror 124C from the sandwich electrode 104C and/or to dissipate heat from the sandwich electrode 104C.

As noted above, an acoustic wave propagates through different materials at different velocities and wavelengths depending on the frequency and type of material. Thus, an acoustic thickness of a layer of material indicates a fraction of a wavelength of a frequency in a material, which depends on an acoustic velocity of the material. In this regard, in an exemplary aspect described with reference to BAW device 100A in FIG. 1, for example, a total acoustic thickness of the piezoelectric layer 102A and the first electrode 104A is between 90% and 110% of an acoustic thickness of the first sandwich electrode 106A. In some examples, the total acoustic thickness of the piezoelectric layer 102A and the first electrode 104A is between 95% and 105% of the acoustic thickness of the first sandwich electrode 106A. In some examples, with reference to the BAW device 100C FIG. 1, the piezoelectric layer 102C comprises a first acoustic thickness, the first electrode 104C comprises the first acoustic thickness, and the first sandwich electrode 106C comprises the first acoustic thickness. In some examples, an acoustic thickness of the first electrode 104C and an acoustic thickness of the first sandwich electrode 106C are each 90% to 110% of an acoustic thickness of the piezoelectric layer 102C. In some examples, with reference to the BAW devices 100A and 100B in FIG. 1, an acoustic thickness of the impedance layer 128A/128B is one of 50% and 150% of an acoustic thickness of the first sandwich electrode 106A/106B.

Figure 2:
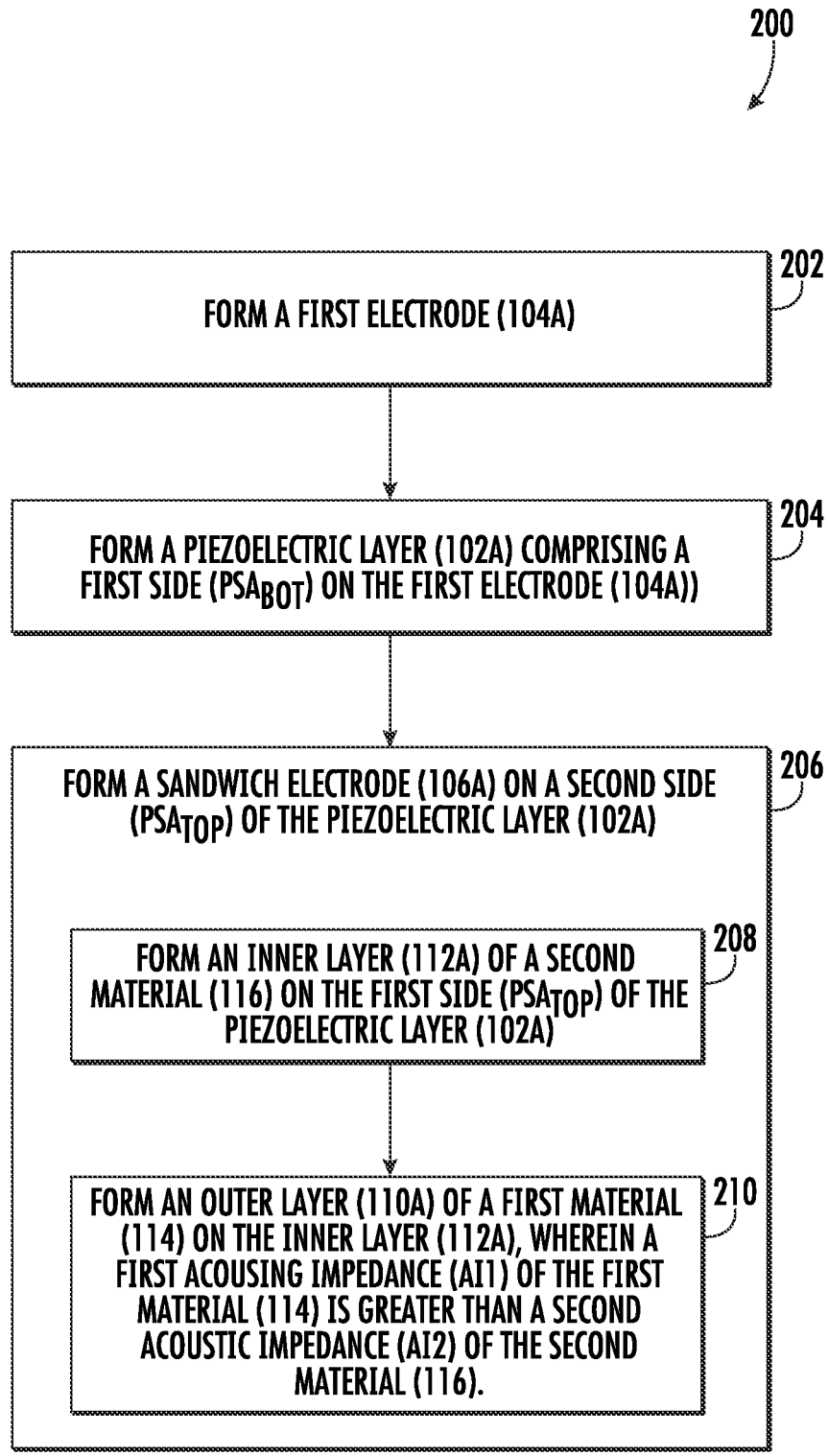
FIG. 2 is a flowchart of a method of fabricating the exemplary BAW device in FIG. 1.

FIG. 2 is a flowchart of a method of making a BAW device, comprising forming a first electrode 104A (block 202) and forming a piezoelectric layer 102A comprising a first side PSA$_{BOT}$ on the first electrode 104A (block 204). The method includes forming a sandwich electrode 106A on a second side PSA$_{TOP}$ of the piezoelectric layer 102A (block 206). Wherein forming the sandwich electrode comprises forming an inner layer 112A of a second material 116 on the first side PSA$_{TOP}$ of the piezoelectric layer 102A (block 208); and forming an outer layer 110A comprising a first material 114 on the inner layer 112A, wherein a first acoustic impedance AI1 of the first material 114 is greater than a second acoustic impedance AI2 of the second material 116 (block 210).

FIGS. 3A and 3B show graphical representations of acoustic waves in the BAW devices 100A and 100B, comprising impedance layers 128A, 128B having a thickness of one-quarter of the resonant wavelength WA (e.g., WA/4) and three-quarters of the resonant wavelengths WB (e.g., 3×WB/4).

FIG. 3A includes section 302A corresponding to the sandwich electrode 106A and section 304A corresponding to the piezoelectric layer 102A and the electrode 104A. The sections 302 and 304 have a same acoustic length, and thus each makes up about half of a total cavity length. As noted above, the physical thicknesses of the sections 302A and 304A will vary depending on the materials from which layers are formed and on the fraction of a wavelength attributed to each layer. In this example, the sections 302 and 304 correspond to fractions F1 and F4 of a wavelength WA of the resonant frequency FA. With fraction F1 of the wavelength WA of the resonant frequency FA corresponding to a physical thickness T$_{106A}$ of the sandwich electrode 106A represented by section 302A and the section 304A corresponds to the fraction F4 of the wavelength WA, where F1+F4=1, FIG. 3A shows that the BAW device 100A has a resonant frequency at which a full wavelength is equal to the acoustic cavity length, which is twice the frequency of a conventional device of comparable thickness. Sections 306A and 308A of FIG. 3A show the magnitude of the acoustic wave being reduced in the first acoustic mirror 124A and further dissipated in the second acoustic mirror 126A. As noted, the impedance layer 128A in the first acoustic mirror 124A has a thickness of approximately one-quarter of the wavelength WA.

FIG. 3B includes section 302B corresponding to the sandwich electrode 106B, and section 304B, which corresponds to the piezoelectric layer 102B combined with the electrode 104B. The sections 302B and 304B each represent half of a total cavity length TB, which is approximately equal to a full wavelength WB of the resonant frequency FB. The impedance layer 128B in the first acoustic mirror 124B of the BAW device 100B has a thickness of approximately three-quarters of the wavelength WA to reduce the magnitude of the acoustic wave, which is further dissipated in the second acoustic mirror 126B.

Figure 4:
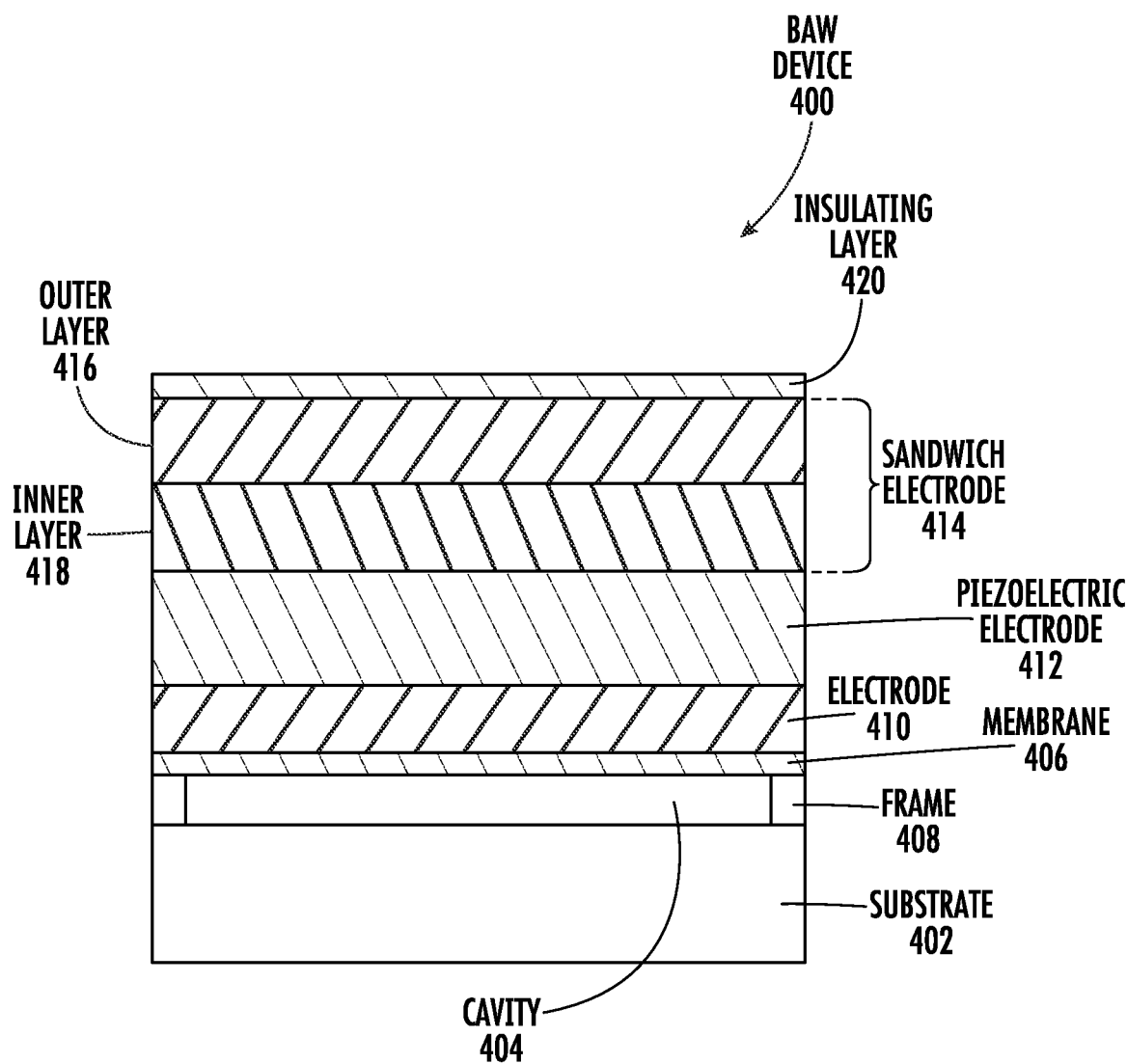
FIG. 4 is an illustration of a cross-sectional side view of an example of a Film Bulk Acoustic Resonator (FBAR) device, including a sandwich electrode as disclosed herein.

FIG. 4 is a cross-sectional side view of an FBAR type of BAW device 400 corresponding to the SMR type of BAW device 100A. The BAW device 400 is an example in which isolation from a substrate 402 is provided by an air cavity 404 rather than an acoustic mirror. The BAW device 400 is separated from the air cavity 404 by a membrane 406 supported by a frame 408. An electrode 410 is coupled to the membrane 406. The BAW device 400 includes a piezoelectric layer 412 on the electrode 410 and a sandwich electrode 414 on a top side $P_{TOP}$ of the piezoelectric layer 412. In alternative examples, the positions of the electrode 410 and the sandwich electrode 414 may be reversed. In such an alternative, approximately the same resonant frequency $F_{400}$ may be achieved as long as an inner layer 416, having a lower acoustic impedance, is disposed between the piezoelectric layer 412 and an outer layer 418 having a higher acoustic impedance than the inner layer 416, where the inner layer 416 and outer layer 418 form the sandwich electrode 414. An insulating layer 420, such as silicon nitride (SiN), is disposed on the sandwich electrode 414.

Figure 5:
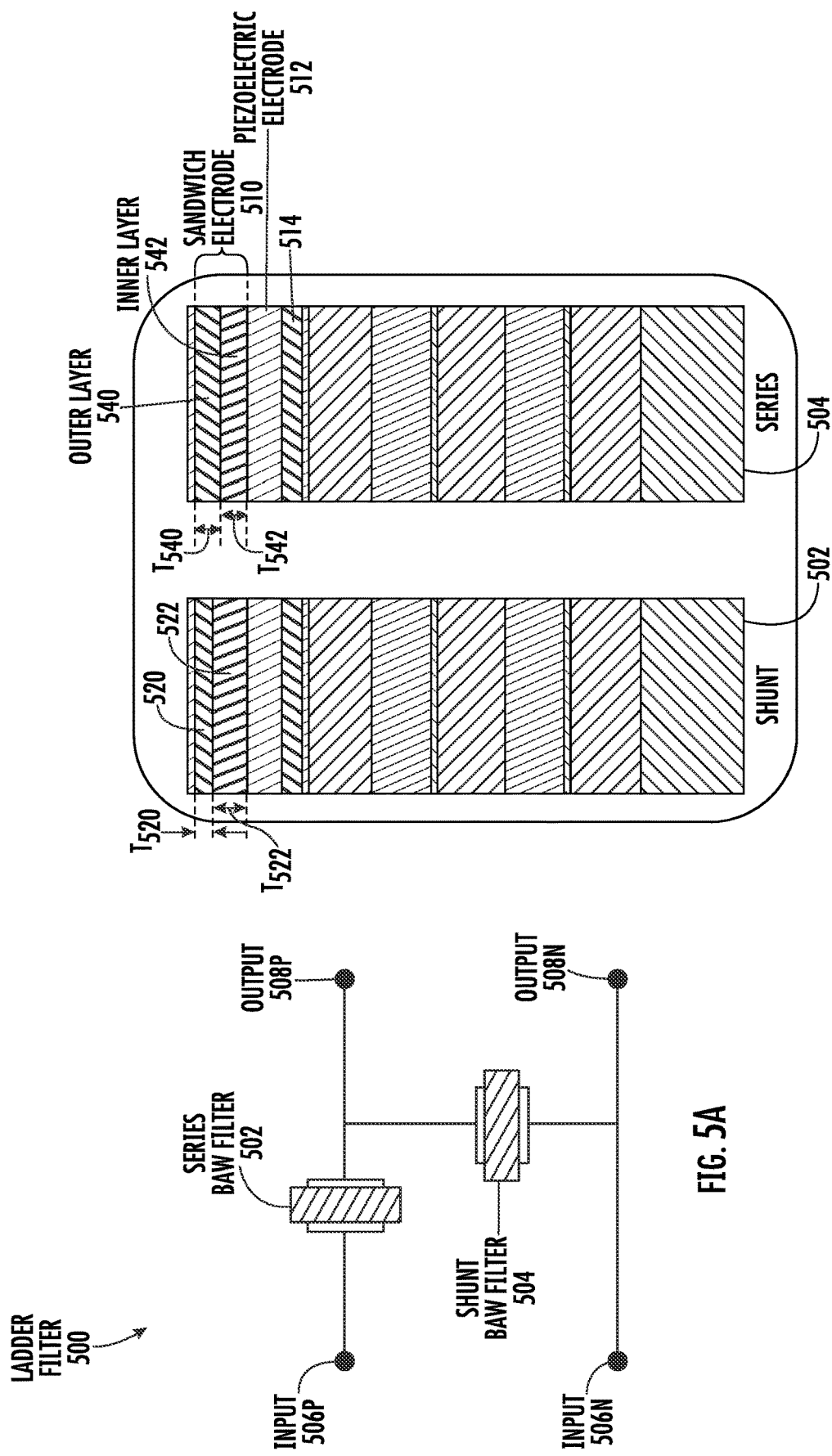
FIG. 5A is an example of a ladder filter including a series BAW device and a shunt BAW device.
FIG. 5B is a cross-sectional side view of the series BAW device and the shunt BAW device in FIG. 5A.

FIG. 5A is a schematic diagram of a ladder filter 500, which is one example of an acoustic filter, including a series BAW device 502 and a shunt BAW device 504 that are coupled between inputs 506P/506N and outputs 508P/508N. Ladder filters may include multiple series BAW devices and multiple shunt BAW devices in other configurations. FIG. 5B is a cross-sectional side view of the series BAW device 502 and the shunt BAW device 504, each of which may be the BAW device 100B in FIG. 1 (e.g., having a mirror layer corresponding to ¾ of the resonant wavelength). The electrical interconnections of the ladder filter 500 are not shown in FIG. 5B. It should be understood that ladder filters corresponding to the ladder filter 500 may be made with any of the BAW devices 100A, 100B, or 100C.

Each of the BAW devices 502, 504 includes a sandwich electrode 510 on the top side $P_{TOP}$ of a piezoelectric layer 512 and an electrode 514 on a bottom side $P_{BOT}$ of the piezoelectric layer 512. The BAW devices 502, 504 also include acoustic mirrors corresponding to the acoustic mirrors 124B and 126B in BAW device 100B, which use an impedance layer having a thickness of ¾ of the wavelength WB to reduce acoustic wave propagation.

Desired operation of the ladder filter 500 is based on a difference in resonant frequencies between the series BAW device 502 and the shunt BAW device 504. A difference in resonant frequency may be achieved by changing a ratio of the acoustic thickness of layers of the sandwich electrode 510, as described with reference to FIG. 5B. It is also possible to suppress many of the spurious modes outside of a main passband when the acoustic thickness ratios of the sandwich electrodes in the series BAW device 502 and the shunt BAW device 504 are correctly chosen. An outer layer 520 of the sandwich electrode 410 in the shunt BAW device 502 has a thickness $T_{520}$, and an inner layer 522 has a thickness $T_{522}$. An outer layer 540 of the sandwich electrode 510 in the series BAW device 504 has a thickness $T_{540}$, and an inner layer 542 has a thickness $T_{542}$. In an overly simplified example, in which the acoustic velocities of all of the outer layer 520, inner layer 522, outer layer 540, and inner layer 542 are the same, then the ratios of their physical thicknesses would correspond to their acoustic thickness ratios. Following this example, in FIG. 5B, a ratio of the thickness $T_{520}$ to the thickness $T_{522}$ (i.e., $T_{520}/T_{-522}$) is different than a ratio of the thickness $T_{540}$ to the thickness $T_{542}$ (i.e., $T_{540}/T_{542}$). In other words, even though the sandwich electrodes 510 in the shunt BAW device 502 and the series BAW device 504 each make up about half of the acoustic cavity length of the shunt BAW device 502 and the series BAW device 504, respectively, the ratio of thickness $T_{520}$ of the outer layer 520 to the thickness $T_{522}$ of the inner layer 522 may be different from a ratio of the thickness $T_{542}$ of the inner layer 542 to the thickness $T_{540}$ of the outer layer 540. Therefore, in this example, the acoustic ratios of the sandwich layers 510 in the shunt BAW device 502 and the series BAW device 504 are different. By adjusting the sandwich electrodes 510 of the shunt BAW device 502 and the series BAW device 504 to have different thickness ratios (e.g., to provide different acoustic thickness ratios), a difference in the resonant frequencies can be adjusted to achieve the desired operation of the ladder filter 500. The differences in ratios may be used to determine a bandwidth of the ladder filter 500. The resonant frequencies of series BAW device 502 and the shunt BAW device 504 may be tuned by modifying total thicknesses of the sandwich electrodes.

According to aspects disclosed herein, the acoustic wave device with tuned resonator piezoelectric thickness may be provided in or integrated into any processor-based device. Examples, without limitation, include a set-top box, an entertainment unit, a navigation device, a communications device, a fixed location data unit, a mobile location data unit, a global positioning system (GPS) device, a mobile phone, a cellular phone, a smartphone, a session initiation protocol (SIP) phone, a tablet, a phablet, a server, a computer, a portable computer, a mobile computing device, a wearable computing device (e.g., a smartwatch, a health or fitness tracker, eyewear, etc.), a desktop computer, a personal digital assistant (PDA), a monitor, a computer monitor, a television, a tuner, a radio, a satellite radio, a music player, a digital music player, a portable music player, a digital video player, a video player, a digital video disc (DVD) player, a portable digital video player, an automobile, a vehicle component, avionics systems, a drone, and a multicopter.

Figure 6:
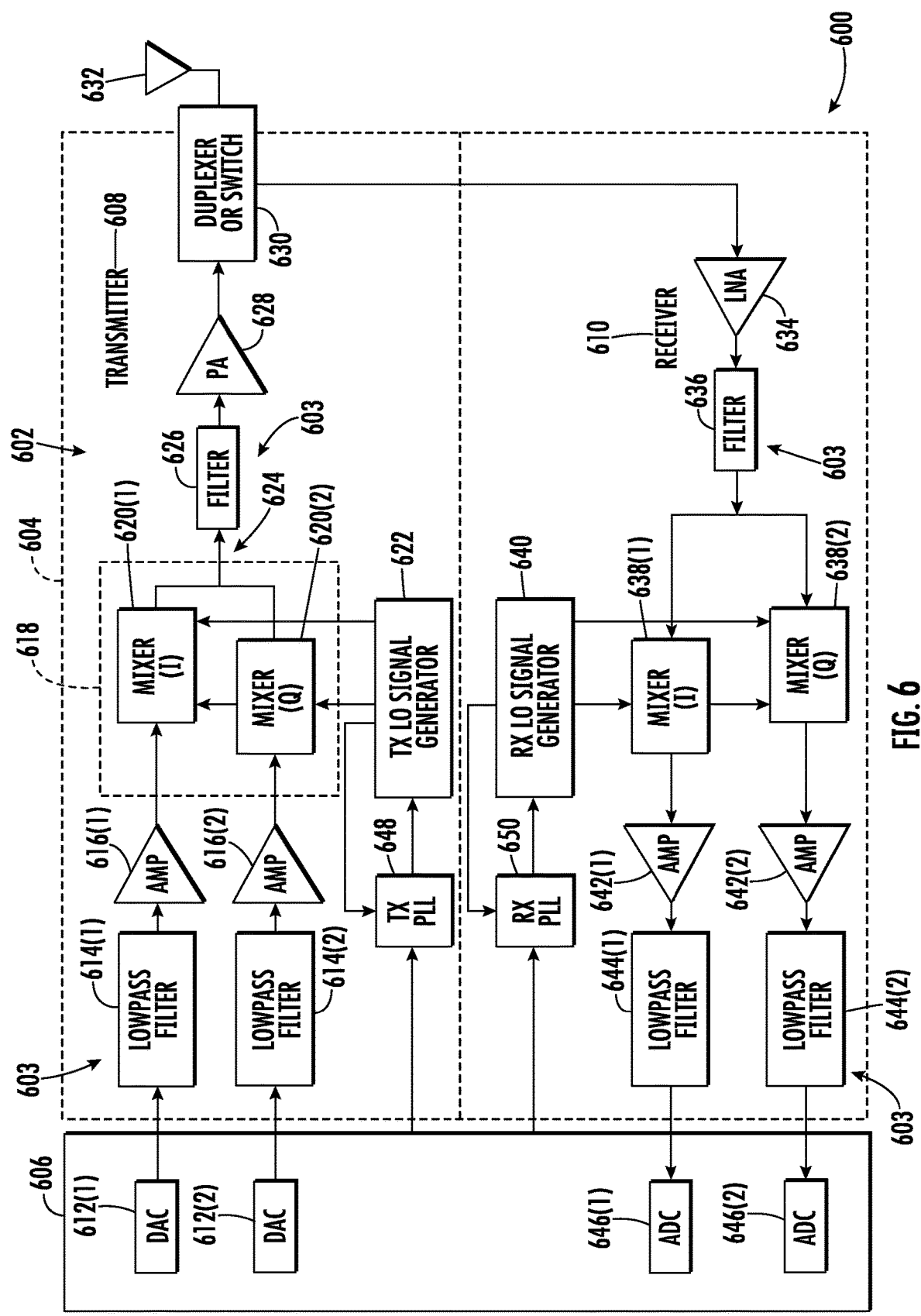
FIG. 6 is a block diagram of an exemplary wireless communications device that includes a sandwich electrode for higher resonant frequency, including but not limited to the BAW devices in FIG. 1.

FIG. 6 illustrates an exemplary wireless communications device 600 that includes radio-frequency (RF) components formed from one or more integrated circuits (ICs) 602 and can include an exemplary BAW device in which a wavelength of a resonant frequency is approximately equal to two times a thickness of a sandwich electrode on one side of a piezoelectric layer, as shown in FIG. 1, and according to any of the aspects disclosed herein. The wireless communications device 600 may include or be provided in any of the above-referenced devices as examples. As shown in FIG. 6, the wireless communications device 600 includes a transceiver 604 and a data processor 606. The data processor 606 may include a memory to store data and program codes. The transceiver 604 includes a transmitter 608 and a receiver 610 that support bi-directional communications. In general, the wireless communications device 600 may include any number of transmitters 608 and/or receivers 610 for any number of communication systems and frequency bands. All or a portion of the transceiver 604 may be implemented on one or more analog ICs, RFICs, mixed-signal ICs, etc.

The transmitter 608 or the receiver 610 may be implemented with a super-heterodyne architecture or a direct-conversion architecture. In the super-heterodyne architecture, a signal is frequency-converted between RF and baseband in multiple stages, e.g., from RF to an intermediate frequency (IF) in one stage and then from IF to baseband in another stage. In the direct-conversion architecture, a signal is frequency-converted between RF and baseband in one stage. The super-heterodyne and direct-conversion architectures may use different circuit blocks and/or have different requirements. In the wireless communications device 600 in FIG. 6, the transmitter 608 and the receiver 610 are implemented with the direct-conversion architecture.

In the transmit path, the data processor 606 processes data to be transmitted and provides I and Q analog output signals to the transmitter 608. In the exemplary wireless communications device 600, the data processor 606 includes digital-to-analog converters (DACs) 612(1), 612(2) for converting digital signals generated by the data processor 606 into the I and Q analog output signals, e.g., I and Q output currents, for further processing.

Within the transmitter 608, lowpass filters 614(1), 614(2) filter the I and Q analog output signals, respectively, to remove undesired signals caused by the prior digital-to-analog conversion. The lowpass filters 614(1), 614(2) may be implemented as BAW filter packages 603. Amplifiers (AMPs) 616(1), 616(2) amplify the signals from the lowpass filters 614(1), 614(2), respectively, and provide I and Q baseband signals. An upconverter 618 upconverts the I and Q baseband signals with I and Q transmit (TX) local oscillator (LO) signals from a TX LO signal generator 622 through mixers 620(1), 620(2) to provide an upconverted signal 624. A filter 626 filters the upconverted signal 624 to remove undesired signals caused by the frequency upconversion as well as noise in a receive frequency band. A power amplifier (PA) 628 amplifies the upconverted signal 624 from the filter 626 to obtain the desired output power level and provides a transmit RF signal. The transmit RF signal is routed through a duplexer or switch 630 and transmitted via an antenna 632. Any of the lowpass filters 614(1) and 614(2), or the filter 626, may be an acoustic wave filter (AW filter) packages 603, which may comprise any of the BAW devices 100A, 100B, 100C in FIG. 1.

In the receive path, the antenna 632 receives signals transmitted by base stations and provides a received RF signal, which is routed through the duplexer or switch 630 and provided to a low noise amplifier (LNA) 634. The duplexer or switch 630 is designed to operate with a specific receive (RX)-to-TX duplexer frequency separation, such that RX signals are isolated from TX signals. The received RF signal is amplified by the LNA 634 and filtered by a filter 636 to obtain a desired RF input signal. Downconversion mixers 638(1), 638(2) mix the output of the filter 636 with I and Q RX LO signals (i.e., LO_I and LO_Q) from an RX LO signal generator 640 to generate I and Q baseband signals. The I and Q baseband signals are amplified by AMPs 642(1), 642(2) and further filtered by lowpass filters 644(1), 644(2) to obtain I and Q analog input signals, which are provided to the data processor 606. Any of the filter 636 and the lowpass filters 644(1), 644(2) may be BAW filter packages 603. In this example, the data processor 606 includes analog-to-digital converters (ADCs) 646(1), 646(2) for converting the analog input signals into digital signals to be further processed by the data processor 606.

In the wireless communications device 600 of FIG. 6, the TX LO signal generator 622 generates the I and Q TX LO signals used for frequency upconversion, while the RX LO signal generator 640 generates the I and Q RX LO signals used for frequency downconversion. Each LO signal is a periodic signal with a particular fundamental frequency. A TX phase-locked loop (PLL) circuit 648 receives timing information from the data processor 606 and generates a control signal used to adjust the frequency and/or phase of the TX LO signals from the TX LO signal generator 622. Similarly, an RX PLL circuit 650 receives timing information from the data processor 606 and generates a control signal used to adjust the frequency and/or phase of the RX LO signals from the RX LO signal generator 640.

Wireless communications devices 600 that can each include an exemplary BAW device manufactured according to any of the aspects described herein, e.g., in which top electrodes are disposed on an, optionally planar, surface of a piezoelectric layer that is thinned in a region to tune acoustic resonators to different frequencies, as illustrated in FIGS. 1 and 4A-4H, and according to any of the aspects disclosed herein, may be provided in or integrated into any processor-based device. Examples, without limitation, include a set-top box, an entertainment unit, a navigation device, a communications device, a fixed location data unit, a mobile location data unit, a global positioning system (GPS) device, a mobile phone, a cellular phone, a smartphone, a session initiation protocol (SIP) phone, a tablet, a phablet, a server, a computer, a portable computer, a mobile computing device, a wearable computing device (e.g., a smartwatch, a health or fitness tracker, eyewear, etc.), a desktop computer, a personal digital assistant (PDA), a monitor, a computer monitor, a television, a tuner, a radio, a satellite radio, a music player, a digital music player, a portable music player, a digital video player, a video player, a digital video disc (DVD) player, a portable digital video player, an automobile, a vehicle component, avionics systems, a drone, and a multicopter.

Figure 7:
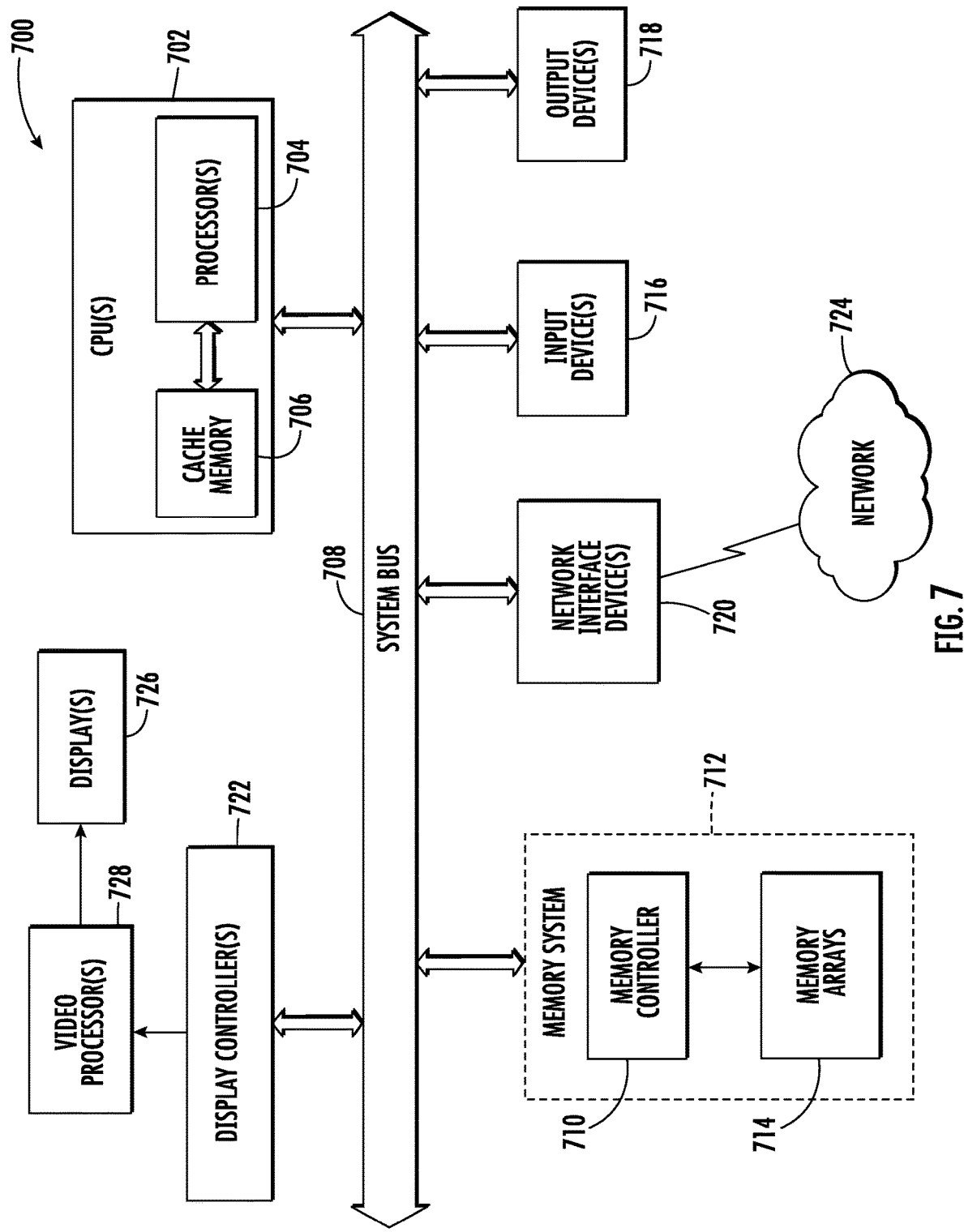
FIG. 7 is a block diagram of an exemplary processor-based system that can include the BAW device that includes a sandwich electrode for higher resonant frequency, including but not limited to the BAW devices in FIG. 1.

FIG. 7 illustrates an example of a processor-based system 700 including circuits including an exemplary BAW device in which a wavelength of a resonant frequency is approximately equal to two times a thickness of a sandwich electrode on one side of a piezoelectric layer, as shown in FIG. 1, and according to any aspects disclosed herein. In this example, the processor-based system 700 includes one or more central processor units (CPUs) 702, which may also be referred to as CPU or processor cores, each including one or more processors 704. The CPU(s) 702 may have cache memory 706 coupled to the processor(s) 704 for rapid access to temporarily stored data. The CPU(s) 702 is coupled to a system bus 708 and can intercouple master and slave devices included in the processor-based system 700. As is well known, the CPU(s) 702 communicates with these other devices by exchanging address, control, and data information over the system bus 708. For example, the CPU(s) 702 can communicate bus transaction requests to a memory controller 710 as an example of a slave device. Although not illustrated in FIG. 7, multiple system buses 708 could be provided; wherein each system bus 708 constitutes a different fabric.

Other master and slave devices can be connected to the system bus 708. As illustrated in FIG. 7, these devices can include a memory system 712 that includes the memory controller 710 and one or more memory arrays 714, one or more input devices 716, one or more output devices 718, one or more network interface devices 720, and one or more display controllers 722, as examples. The input device(s) 716 can include any type of input device, including, but not limited to, input keys, switches, voice processors, etc. The output device(s) 718 can include any type of output device, including, but not limited to, audio, video, other visual indicators, etc. The network interface device(s) 720 can be any device configured to allow an exchange of data to and from a network 724. The network 724 can be any type of network, including, but not limited to, a wired or wireless network, a private or public network, a local area network (LAN), a wireless local area network (WLAN), a wide area network (WAN), a BLUETOOTH™ network, and the Internet. The network interface device(s) 720 can be configured to support any type of communications protocol desired.

The CPU(s) 702 may also be configured to access the display controller(s) 722 over the system bus 708 to control information sent to one or more displays 726. The display controller(s) 722 sends information to the display(s) 726 to be displayed via one or more video processors 728, which process the information to be displayed into a format suitable for the display(s) 726. The display(s) 726 can include any type of display, including, but not limited to, a cathode ray tube (CRT), a liquid crystal display (LCD), a plasma display, or a light-emitting diode (LED) display, etc.

Those of skill in the art will further appreciate that the various illustrative logical blocks, modules, circuits, and algorithms described in connection with the aspects disclosed herein may be implemented as electronic hardware, instructions stored in memory or another computer-readable medium and executed by a processor or other processing device, or combinations of both. As examples, the master and slave devices described herein may be employed in any circuit, hardware component, IC, or IC chip. Memory disclosed herein may be any type and size of memory and may be configured to store any type of information desired. To clearly illustrate this interchangeability, various illustrative components, blocks, modules, circuits, and steps have been described above generally in terms of their functionality. How such functionality is implemented depends upon the particular application, design choices, and/or design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the aspects disclosed herein may be implemented or performed with a processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A processor may be a microprocessor, but in the alternative, the processor may be any conventional processor, controller, microcontroller, or state machine. A processor may also be implemented as a combination of computing devices (e.g., a combination of a DSP and a microprocessor, a plurality of microprocessors, one or more microprocessors in conjunction with a DSP core, or any other such configuration).

The aspects disclosed herein may be embodied in hardware and in instructions that are stored in hardware and may reside, for example, in Random Access Memory (RAM), flash memory, Read-Only Memory (ROM), Electrically Programmable ROM (EPROM), Electrically Erasable Programmable ROM (EEPROM), registers, a hard disk, a removable disk, a CD-ROM, or any other form of computer-readable medium known in the art. An exemplary storage medium is coupled to the processor such that the processor can read information from and write information to the storage medium. In the alternative, the storage medium may be integral to the processor. The processor and the storage medium may reside in an ASIC. The ASIC may reside in a remote station. Alternatively, the processor and the storage medium may reside as discrete components in a remote station, base station, or server.

It is also noted that the operational steps described in any of the exemplary aspects herein are described to provide examples and discussion. The operations described may be performed in numerous different sequences other than the illustrated sequences. Furthermore, operations described in a single operational step may actually be performed in several different steps. Additionally, one or more operational steps discussed in the exemplary aspects may be combined. It is to be understood that the operational steps illustrated in the flowchart diagrams may be subject to numerous different modifications as will be readily apparent to one of skill in the art. Those of skill in the art will also understand that information and signals may be represented using various technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The previous description of the disclosure is provided to enable any person skilled in the art to make or use the disclosure. Various modifications to the disclosure will be readily apparent to those skilled in the art, and the generic principles defined herein may be applied to other variations. Thus, the disclosure is not intended to be limited to the examples and designs described herein but is to be accorded the widest scope consistent with the principles and novel features disclosed herein.

Implementation examples are described in the following numbered clauses:

1. A bulk acoustic wave (BAW) device, comprising:
   a piezoelectric layer;
   a first electrode on a first side of the piezoelectric layer; and
   a first sandwich electrode on a second side of the piezoelectric layer, the first sandwich electrode comprising:
   a first layer of a first material having a first acoustic impedance; and
   a second layer of a second material having a second acoustic impedance less than the first acoustic impedance, the second layer disposed between the first layer and the piezoelectric layer.

2. The BAW device of clause 1, wherein:
   the first material and the first electrode comprise molybdenum (Mo); and
   the second material comprises aluminum and copper (AlCu).

3. The BAW device of clause 1 or clause 2, wherein the first electrode comprises a second sandwich electrode, further comprising:
   a third layer of the first material; and
   a fourth layer of the second material disposed between the third layer and the piezoelectric layer.

4. The BAW device of any one of clause 1 to clause 3, further comprising:
   a substrate adjacent to one of the first electrode and the first sandwich electrode; and
   an air cavity between the substrate and the one of the first electrode and the first sandwich electrode.

5. The BAW device of any one of clause 1 to clause 3, further comprising an acoustic mirror disposed on one of the first electrode and the first sandwich electrode.

6. The BAW device of clause 5, wherein the acoustic mirror comprises:
   a first mirror layer comprising one of a first dielectric layer and a first metal layer; and
   a second mirror layer comprising one of a second dielectric layer and a second metal layer.
7. The BAW device of clause 6, wherein the first dielectric layer comprises silicon dioxide ($SiO_2$), and the first metal layer comprises tungsten (W).
8. The BAW device of any one of clause 1 to clause 7 integrated into a semiconductor die.
9. The BAW device of any one of clause 1 to clause 8 integrated into a device selected from the group consisting of: a set-top box; an entertainment unit; a navigation device; a communications device; a fixed location data unit; a mobile location data unit; a global positioning system (GPS) device; a mobile phone; a cellular phone; a smartphone; a session initiation protocol (SIP) phone; a tablet; a phablet; a server; a computer; a portable computer; a mobile computing device; a wearable computing device; a desktop computer; a personal digital assistant (PDA); a monitor; a computer monitor; a television; a tuner; a radio; a satellite radio; a music player; a digital music player; a portable music player; a digital video player; a video player; a digital video disc (DVD) player; a portable digital video player; an automobile; a vehicle component; avionics systems; a drone; and a multicopter.
10. A method of making a BAW device, the method comprising:
    forming a first electrode;
    forming a piezoelectric layer comprising a first side on the first electrode; and
    forming a sandwich electrode on a second side of the piezoelectric layer, comprising:
      forming a second layer of a second material on the second side of the piezoelectric layer; and
      forming a first layer comprising a first material on the second layer,
      wherein a first acoustic impedance of the first material is greater than a second acoustic impedance of the second material.
11. An acoustic filter comprising:
    a first bulk acoustic wave (BAW) device; and
    a second BAW device;
    wherein each of the first BAW device and the second BAW device comprises:
      a piezoelectric layer;
      a first electrode on a first side of the piezoelectric layer; and
      a sandwich electrode on a second side of the piezoelectric layer, the sandwich electrode comprising:
        a first layer of a first material having a first acoustic impedance; and
        a second layer of a second material having a second acoustic impedance less than the first acoustic impedance, the second layer disposed between the first layer and the piezoelectric layer.
12. The acoustic filter of clause 11, wherein a first ratio of a thickness of the first layer to a thickness of the second layer of the sandwich electrode in the first BAW device is different than a second ratio of a thickness of the first layer to a thickness of the second layer of the sandwich electrode in the second BAW device.
13. The acoustic filter of clause 11 or clause 12, wherein in one of the first BAW device and the second BAW device, a thickness of the second layer of the sandwich electrode is greater than a thickness of the first layer of the sandwich electrode.
14. The acoustic filter of any one of clause 11 to clause 13, wherein in each of the first BAW device and the second BAW device, the first electrode comprises:
    a third layer of the first material; and
    a fourth layer of the second material disposed between the third layer and the piezoelectric layer.
15. The acoustic filter of any one of clause 11 to clause 14, further comprising a ladder filter, wherein:
    the first BAW device is a series-coupled device; and
    the second BAW device is a shunt-coupled device.

What is claimed is:
1. An acoustic filter comprising:
   a first bulk acoustic wave (BAW) device; and
   a second BAW device;
   wherein each of the first BAW device and the second BAW device comprises:
     a piezoelectric layer;
     a first electrode on a first side of the piezoelectric layer; and
     a sandwich electrode on a second side of the piezoelectric layer, the sandwich electrode comprising:
       a first layer of a first material having a first acoustic impedance; and
       a second layer of a second material having a second acoustic impedance less than the first acoustic impedance, the second layer disposed between the first layer and the piezoelectric layer, wherein a first ratio of a thickness of the first layer to a thickness of the second layer of the sandwich electrode in the first BAW device is different than a second ratio of a thickness of the first layer to a thickness of the second layer of the sandwich electrode in the second BAW device.
2. The acoustic filter of claim 1, wherein in one of the first BAW device and the second BAW device, a thickness of the second layer of the sandwich electrode is greater than a thickness of the first layer of the sandwich electrode.
3. The acoustic filter of claim 1, wherein in each of the first BAW device and the second BAW device, the first electrode comprises:
   a third layer of the first material; and
   a fourth layer of the second material disposed between the third layer and the piezoelectric layer.
4. The acoustic filter of claim 1, further comprising a ladder filter, wherein:
   the first BAW device is a series-coupled device; and
   the second BAW device is a shunt-coupled device.
5. The acoustic filter of claim 1, wherein an acoustic thickness of the first sandwich electrode in at least one of the first BAW device and the second BAW device substantially corresponds to half of a wavelength of a resonant frequency of the at least one of the first BAW device and the second BAW device.
6. The acoustic filter of claim 1, further comprising, in at least one of the first BAW device and the second BAW device, an acoustic mirror disposed between a substrate and one of the first electrode or the first sandwich electrode, wherein at least one layer of the acoustic mirror has an acoustic thickness substantially corresponding to three-quarters of the wavelength of the resonant frequency of the at least one of the first BAW device and the second BAW device.
7. The acoustic filter of claim 6, wherein the acoustic mirror comprises:

a first mirror layer comprising one of a first dielectric layer and a first metal layer; and a second mirror layer comprising one of a second dielectric layer and a second metal layer.

8. The acoustic filter of claim 7, wherein the first dielectric layer comprises silicon dioxide (SiO$_2$), and the first metal layer comprises tungsten (W).

9. The acoustic filter of claim 1, wherein, in at least one of the first BAW device and the second BAW device:

the first material and the first electrode comprise molybdenum (Mo); and the second material comprises aluminum and copper (AlCu).

10. The acoustic filter of claim 1, wherein, in at least one of the first BAW device and the second BAW device, the first electrode comprises a second sandwich electrode, further comprising:

a third layer of the first material; and a fourth layer of the second material disposed between the third layer and the piezoelectric layer.

11. The acoustic filter of claim 1 integrated into a semiconductor die.

12. The acoustic filter of claim 1 integrated into a device selected from the group consisting of: a set-top box; an entertainment unit; a navigation device; a communications device; a fixed location data unit; a mobile location data unit; a global positioning system (GPS) device; a mobile phone; a cellular phone; a smartphone; a session initiation protocol (SIP) phone; a tablet; a phablet; a server; a computer; a portable computer; a mobile computing device; a wearable computing device; a desktop computer; a personal digital assistant (PDA); a monitor; a computer monitor; a television; a tuner; a radio; a satellite radio; a music player; a digital music player; a portable music player; a digital video player; a video player; a digital video disc (DVD) player; a portable digital video player; an automobile; a vehicle component; avionics systems; a drone; and a multicopter.

* * * * *